United States Patent [19]

Moore et al.

[11] Patent Number: 4,886,734
[45] Date of Patent: Dec. 12, 1989

[54] ELECTRON-BEAM POSITIVE POLYIMIDE

[75] Inventors: James A. Moore; Andrew N. Dasheff, both of Troy; Frank B. Kaufman, Amawalk, all of N.Y.

[73] Assignees: Rensselaer Polytechnic Institute, Troy; International Business Machines Corporation, Armonk, both of N.Y.

[21] Appl. No.: 249,392

[22] Filed: Sep. 26, 1988

[51] Int. Cl.[4] .............................................. G03C 1/495
[52] U.S. Cl. .................................. 430/270; 430/326; 430/311; 430/942; 430/283
[58] Field of Search ................ 430/325, 270, 311, 942

[56] References Cited

U.S. PATENT DOCUMENTS

| | | | |
|---|---|---|---|
| 4,414,059 | 11/1983 | Blum et al. | 156/659.1 |
| 4,508,749 | 4/1985 | Brannon et al. | 427/43.1 |
| 4,568,322 | 2/1986 | Blum et al. | 430/322 |
| 4,579,809 | 4/1986 | Irving | 430/283 |
| 4,612,275 | 9/1986 | Gregor | 430/296 |
| 4,655,874 | 4/1987 | Marks | 156/643 |

FOREIGN PATENT DOCUMENTS 0130481 9/1985 European Pat. Off. .

OTHER PUBLICATIONS

Crivello et al., J. Polym. Sci., Polym. Chem. Ed. 1987, 25 3293-3309; "Photodimerization of Maleic Anhydride".
Boule et al., Tetrahedron Letters No. 11, pp. 865-868, 1976; "Synthesis and Characterization of Photo Sensitive Polyimides".
Barltrop et al., Chemical Communications, pp. 882, 823, Nov. 22, 1966; "Photosensitive Protective Groups".
IBM Tech. Disclosure Bulletin, vol. 16, No. 2, Jul. 1973; pp. 601, 602.
IBM Tech. Disclosure Bulletin, vol. 22, No. 6, Nov. 1979; pp. 2254, 2255.
Yoda et al., J. Macromol. Sci–Chem, A21(13 & 14) pp. 1641–1663 (1984); "New Photosensitive High Temperature Polymers for Electronic Application".

Primary Examiner—Paul R. Michl
Assistant Examiner—C. D. RoDee
Attorney, Agent, or Firm—Notaro & Michalos

[57] ABSTRACT

An insoluble electron beam positive polyimide having the formula

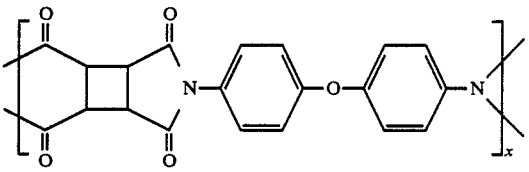

can be exposed by an electron beam to render the exposed areas soluble. The exposed areas can then be dissolved using a solvent to leave the pattern which can be used directly as an insulator layer in a semiconductor device.

6 Claims, 3 Drawing Sheets

ELECTRON-BEAM POSITIVE POLYIMIDE

FIELD AND BACKGROUND OF THE INVENTION

The present invention relates in general to electron-beam lithography techniques for producing semiconductor devices and the like, and in particular to a new and useful method of forming a pattern in an insulator layer for a semiconductor structure utilizing an electron-beam (e-beam) sensitive polyimide which becomes soluble when exposed to the e-beam.

In the fabrication of multi-level metal-insulator integrated circuit structures, a polyimide as KAPTON (a trademark of DuPont) has proven to be a good insulator when applied between metalization layers in integrated circuit structures. This is because of the high thermal stability, chemical resistance and dielectric properties of KAPTON polyimide. KAPTON polyimide has the following formula:

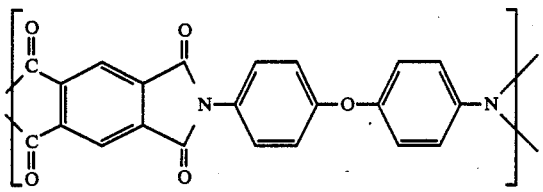

An intermediate polyamic acid which is subjected to heat to form the KAPTON polyimide, is itself soluble and can be spun into films which can be cured into the insoluble polyimide structures. Once the material is cured, it is generally insoluble and infusible and is extremely thermally stable. The insolubility and the infusibility of the KAPTON polyimide requires that patterning of the polyimide layers be accomplished indirectly by photoresist technology. This process entails the spinning and curing of the polyimide layer, formation of a polysulfone lift-off layer and deposition of an $SiO_2$ masking layer followed by a top layer of resist coating.

The pattern is defined by either electron beam or optical lithography and the underlined layers are etched with reactive ion etching. Metal is deposited onto the pattern and the polysulfone and excess are lifted off with a solvent.

If the polyimide layer itself could be made intrinsically photosensitive, the formation of a pattern in the polyimide layer would be greatly simplified. Several photonegative polyimide systems have been developed which utilize photosensitive polyimides. These are generally made by the reaction of the corresponding polyamic acid with a photosensitive group. In the most common case, the intermediate polyamic acid is partially esterified with photo-crosslinkable acids. Irradiation of these esters causes them to become insoluble and enables them to be used to form negative images upon treatment with solvent. After imaging, the films are thermally converted to the polyimide which itself is not sensitive to light.

A positive working system would be more desirable because of the swelling attendant upon solvent development of negative images. A photopositive polyimide containing photosensitive sulfonium salt units has been described in a article by Crivello et al entitled "Synthesis and Characterization of Photosensitive Polyimides", *Journal of Polymer Science: Part A: Polymer Chemistry*, Vol. 25, 3293–3309 (1987).

It would also be advantageous if a positive working system could be derived which, rather than being photosensitive, was sensitive to an electron-beam. Electron-beam lithography has certain advantages and differences from photolithography that makes it particularly useful for certain purposes.

A polyimide resin which has good transparency and is useful to produce molded products with substantially no coloring and good thermal resistance, is disclosed in European patent application 0 130 481 to Noriaki et al. This reference does not consider or discuss the possibility of photo or electron-sensitivity for the polyimide product.

SUMMARY OF THE INVENTION

The present invention involves a process for making and using an intrinsically electron-beam positive polyimide so that direct, positive e-beam lithography can be accomplished even after a complete thermal curing which forms the polyimide structure has taken place.

The process for preparing the e-beam positive polyimide comprises irradiating maleic anhydride (MA) solution with ultraviolet light. See "Photodimerization of Maleic Anhydride in Carbon Tetrachloride", Boule et al., *Tetrahedron Letters*, No. 11, pp. 865–868 (1976). This excites the anhydride molecule to dimerize and form a cyclobutane unit. Because the olefin is consumed in the dimerization process, ultraviolet absorption of the cyclobutane unit shifts to a shorter wavelength. Once the anhydride is formed, it can be used to form a polyimide which can be imaged by irradiation with an electron beam.

The cyclobutane unit is reacted with an aromatic diamine, such as oxydianiline (ODA) to form a polyamic acid which can thereafter be heat cured to produce the corresponding electron-beam positive polyimide which is insoluble.

The invention also includes a method of forming a patterned insulator layer useful for example in a semiconductor structure, which comprises forming a layer of the intrinsically e-beam positive insoluble polyimide, irradiating the layer with an electron-beam pattern to produce exposed and unexposed areas in the layer, the exposed areas becoming soluble, and applying a solvent to the layer to remove the soluble exposed areas to form the patterned insulator layer.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
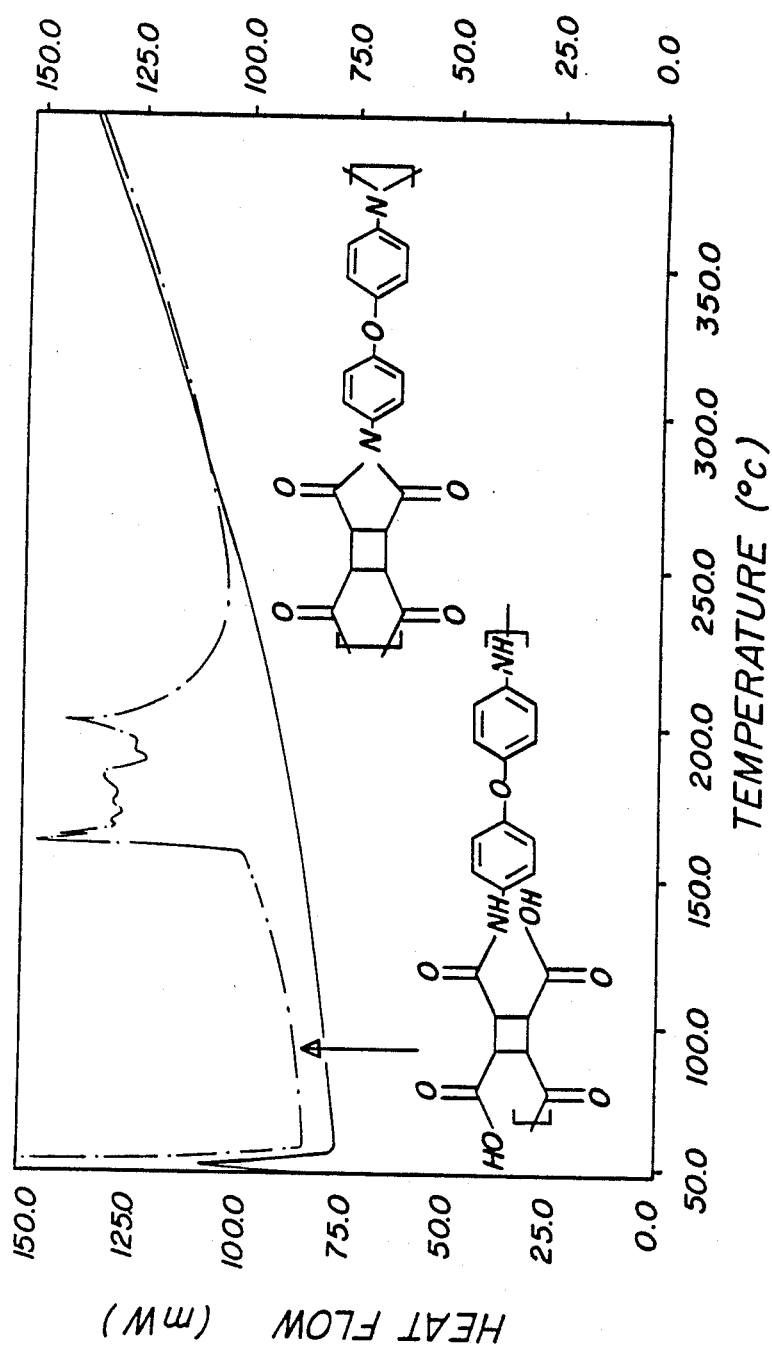
FIG. 1 is a differential scanning calorimogram of the polyamic acid and its conversion into the e-beam sensitive polyimide of the present invention.

The electron-beam positive-acting polyimide in accordance with the present invention is prepared by irradiating a solution of maleic anhydride (I) in carbon tetrachloride with light at a maximum wavelength of 280 nm from a high power mercury arc lamp for one hour. This forms 1, 2, 3, 4-cyclobutane tetracarboxylic 1,2:3,4-dianhydride (CBDA) shown at II in the Equation 1.

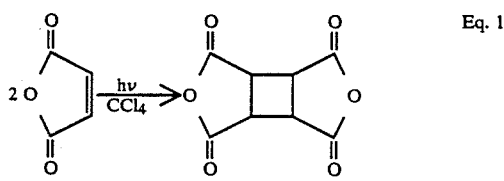

Eq. 1

CBDA is precipitates from solution and is collected by filtration. CBDA (maximum wavelength of absorption 232 nm) is then purified by successive recrystalization from acetic anhydride (until the filtrate is colorless) to yield a white solid.

60 ml of dry DMAC (dimethylacetamide) and 0.64031 g (3.1977 mmoles) of oxydianiline (Aldrich Gold Label, III) are mixed together and reacted in a 3-necked, 100 ml round-bottomed flask fitted with a mechanical stirrer, a nitrogen inlet and a condenser. The reaction was allowed to proceed at room temperature under dry nitrogen for 18.5 hours. The resulting polyamic acid (IV) was precipitated twice into methanol and dried in vacuo at room temperature for 24 hours.

The intrinsic viscosity of the resulting polyamic acid was 1.47 dl/g measured with an Ubbelohde viscometer at 25.00° C. in DMAC.

The polyamic acid is cured to the polyimide (V), as shown in Equation 2, by heating films or layers cast by solvent evaporation in a watch glass, in an oven for two hours at 100° C., two hours at 175° C. and two hours at 250° C.

The resulting uniform polyimide film (V) is colorless.

A thin 0.2 micron thick film of polyimide (V) was formed and exposed to an electron beam of 25 KeV electrons using an electron beam lithography tool. This results in the scission which breaks the polyimide chain as shown at VI in Equation 2. While the polyimide (V) is insoluble in polar, aprotic solvents, such as DMAC and DMF (dimethyl formamide) the exposed compound VI is readily soluble therein. Irradiation doses were from 200 to 500 micro-coulombs/cm² followed by development with DMAC to form a positive image.

Eq. 2

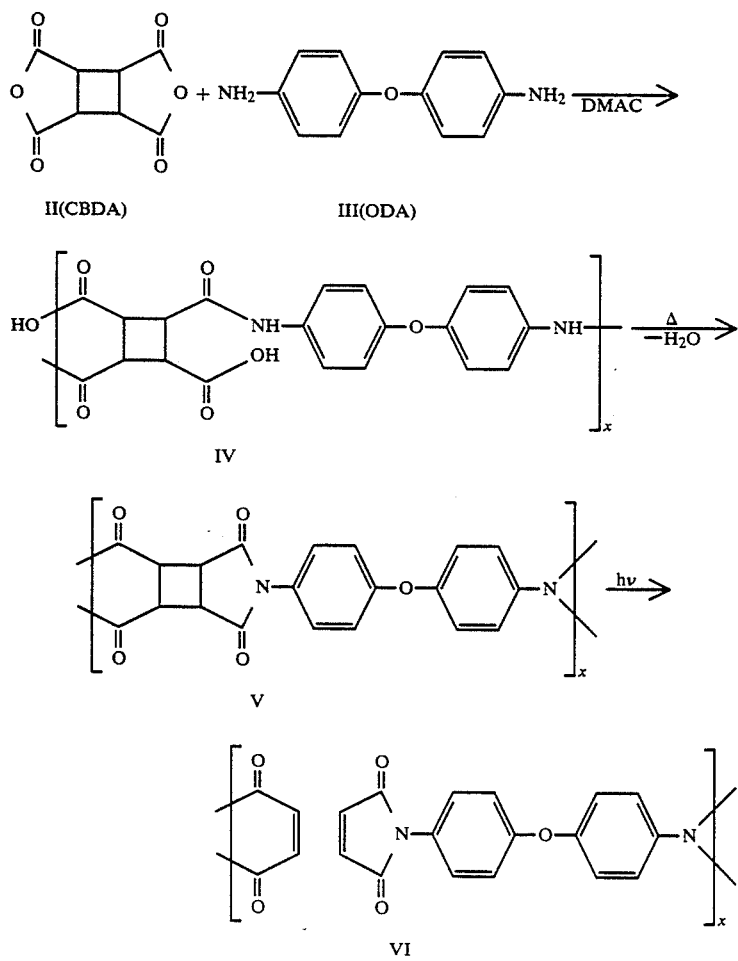

To form the polyamic acid shown at IV in Equation 2, 0.62714 g (3.1977 mmoles) of CBDA (II) is added to The electron-beam positive polyimide of the present invention is, to the knowledge of the inventors, the first electron-beam positive polyimide. It has utility as a high temperature resist material (about 350° C.) for an electron-beam imagaeble dielectric material. Both applications are useful in the fabrication of electronic devices or packages.

FIG. 1 shows a differential scanning calorimogram, under nitrogen, of the polyamic acid. From this scan, it is apparent that conversion of polyamic acid to polyimide takes place in the range of 150° C. to 250° C. Subsequent rescanning of the sample showed no transitions in this range.

Figure 2:
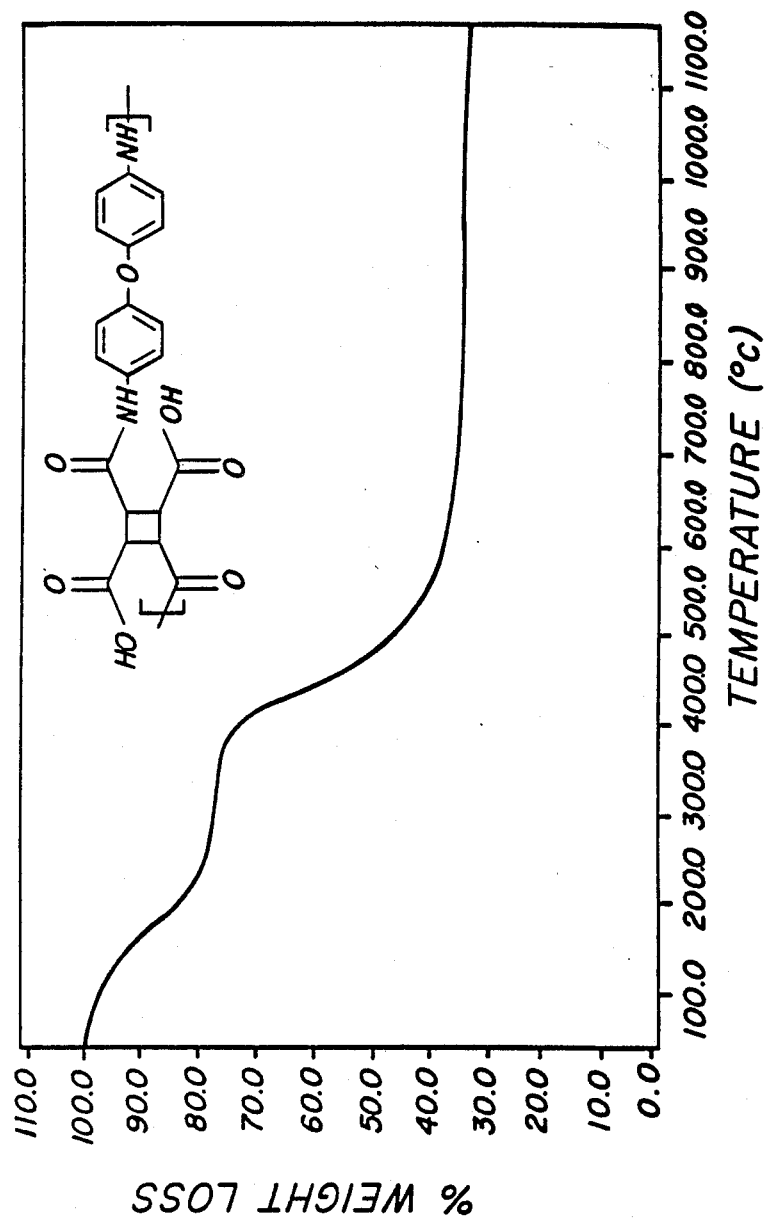
FIG. 2 is a graph plotting weight loss against temperature of the polyamic acid to show its thermogravimetric behavior as it is converted by curing into the e-beam polyimide structure.

FIG. 2 shows the thermogravimetric behavior, under nitrogen, of the polyamic acid. The weight loss corresponding to the curing of the polyamic acid into the insoluble polyimide structure, can be seen. Once the polyimide is formed, 50% weight loss occurs at about 460° C. and after heating the sample to 1200° C. there is a residual weight of approximately 35%. Thus, despite the incorporation of an aliphatic repeat unit in the chain, the thermal stability of the polyimide is quite high.

According to the present invention thus a readily synthesized polyimide is provided which has utility for image generation or the like.

The polyimide V can also be produced by reacting ODA and CBDA in other solvents such as DMF, to yield polyamic acid that is cured to the polyimide.

Figure 3:
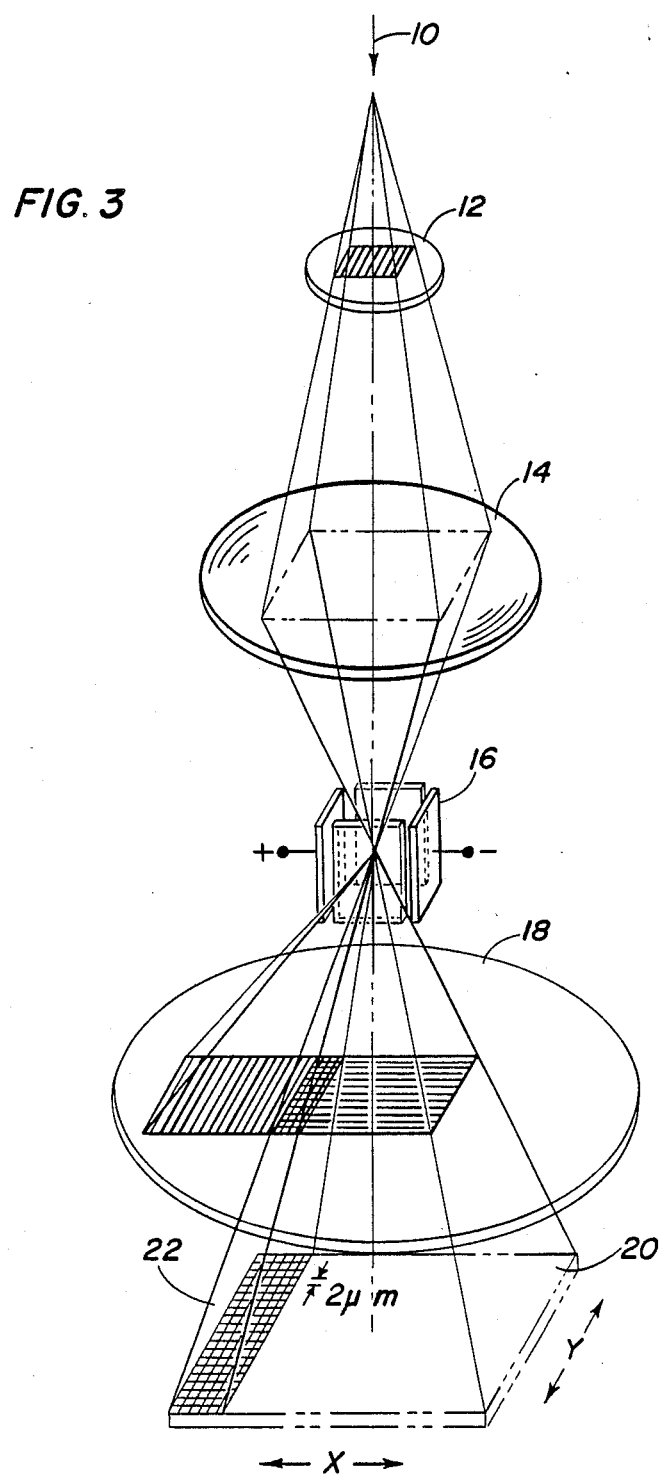
FIG. 3 is a schematic view of an electron-beam lithography device for scanning and irradiating a layer of the polyimide.

FIG. 3 is a schematic representation of an electronic beam lithography tool which can be used in the method of the present invention.

The device of FIG. 3 can produce an integrated circuit pattern on a silicon chip with sub-micron edge definition (resolution). The pattern actually consists of sub-patterns "written" on top of each other with sub-micron overlay accuracy.

To accomplish this, the device comprises an electron source which produces an electron beam 10 which is focused onto small rectangular spots of specified features on a substrate 20 at the bottom of the column. These spots can be controlled in shape, position and intensity with high speed and accuracy. The beam then exposes the substrate which is coated with the polyimide of the present invention that has been shown to be electron beam sensitive.

The shape of the exposure spots is formed by passing the electron beam 10 through a first square aperture 12. The beam is then focused by condensor lens 14 into a spot shaping deflector 16 made of electrically chargeable panels. This produces a first image of the electron source which is shown onto a second square aperture member 18. This produces shaped beam 22 which exposes the surface of substrate 20. Square spots having two to four micro-meter maximum size can thus be generated on the surface of substrate 20. Some of the spots are blank, that is, blocked from any exposure to the electron beam to form unexposed areas.

The exposed areas of the polyimide layer on substrate 20 are rendered soluble so that they can be removed using a solvent to fabricate a pattern on the substrate 20.

While a specific embodiment of the invention has been showed and described in detail to illustrate the application of the principles of the invention, it will be understood that the invention may be embodied otherwise without departing from such principles.

What is claimed is:

1. A method of forming a patterned layer comprising: forming a layer of insoluble polyimide having the formula:

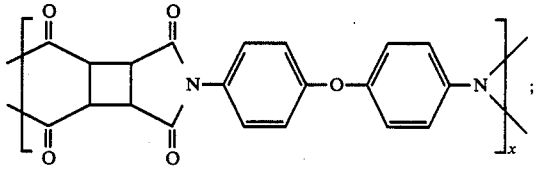

irradiating the layer with an electron beam to produce exposed and unexposed areas in the layer, the exposed areas becoming soluble; and dissolving the exposed areas from the layer using a solvent to form the patterned insoluble layer.

2. A method according to claim 1 wherein the solvent is a polar, aprotic solvent.

3. A method according to claim 1 including irradiating the layer with an incident dosage of from about 200 to 500 micro-coulombs/cm$^2$ of energy.

4. A method according to claim 1 wherein the insoluble polyimide is formed by irradiating maleic anhydride to form cyclobutane tetracarboxylic dianhydride, reacting the cyclobutane tetracarboxylic dianhydride with oxydianiline to form polyamic acid and curing the polyamic acid to form the insoluble polyimide.

5. A method according to claim 4 including curing the polyamic acid into polyimide by heating the polyamic acid.

6. A method according to claim 5 including reacting the cyclobutane tetracarboxylic dianhydride with oxydianiline in the presence of a solvent chosen from a group consisting of dimethyl formamide and DMAC.

* * * * *